(12) United States Patent
Yasumori

(10) Patent No.: US 6,456,474 B2
(45) Date of Patent: *Sep. 24, 2002

(54) SEMICONDUCTOR INTEGRATED CIRCUIT

(75) Inventor: Koji Yasumori, Kanagawa (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/285,687

(22) Filed: Apr. 5, 1999

(30) Foreign Application Priority Data

Apr. 7, 1998 (JP) ............................. 10-094673

(51) Int. Cl.[7] .................................. H02H 9/00
(52) U.S. Cl. ............... 361/91.5; 361/91.1; 361/111; 361/56
(58) Field of Search .................. 361/56, 111, 91.1, 361/91.5; 257/355–360

(56) References Cited

U.S. PATENT DOCUMENTS

| | | | | |
|---|---|---|---|---|
| 4,811,155 A | * | 3/1989 | Kuriyama et al. | 361/56 |
| 4,989,057 A | * | 1/1991 | Lu | 257/357 |
| 5,237,395 A | * | 8/1993 | Lee | 257/358 |
| 5,289,334 A | * | 2/1994 | Ker et al. | 361/56 |
| 5,343,352 A | * | 8/1994 | Nagamine | 361/56 |

FOREIGN PATENT DOCUMENTS

| | | |
|---|---|---|
| JP | 2-23663 | 1/1990 |
| JP | 2-241063 | 9/1990 |
| JP | 4-30570 | 2/1992 |
| JP | 5-505062 | 7/1993 |
| JP | 5-291492 | 11/1993 |
| JP | 9-139468 | 5/1997 |
| JP | 10-84083 | 3/1998 |
| KR | 93-3391 | 8/1993 |

OTHER PUBLICATIONS

Japanese Office Action dated Jan. 26, 1999 with partial translation.
Korean Office Action dated Feb. 28, 2001 with partial English translation.

* cited by examiner

Primary Examiner—Stephen W. Jackson
(74) Attorney, Agent, or Firm—McGinn & Gibb, PLLC (57) ABSTRACT

To improve the reliability by properly operating an overvoltage protection circuit. In case of a semiconductor integrated circuit of the present invention, the source electrode 52s of an nMOS transistor 52 constituting a first-stage input circuit 50 is connected with aground wiring 54 and an overvoltage protection circuit 10 is connected between the ground wiring 54 and the gate electrode 52g of the nMOS transistor 52. The wiring resistance between the source electrode 52s and the overvoltage protection circuit 10 is very small. Therefore, because applied voltage values of the nMOS transistor 52 and the overvoltage protection circuit 10 are equalized each other when an overvoltage is generated, the overvoltage protection circuit 10 properly operates and thereby, it is possible to protect the nMOS transistor 52.

21 Claims, 7 Drawing Sheets

PRIOR ART

SEMICONDUCTOR INTEGRATED CIRCUIT

BACKGROUND OF THE INVENTION

1. Field of the Invention

The present invention relates to a semiconductor integrated circuit provided with an overvoltage protection circuit for preventing breakdown due to static electricity.

2. Description of the Prior Art

A semiconductor integrated circuit has a structure in which a chip comprised of many semiconductor devices is stored in a package and a pin electrically connected to the chip protrudes beyond the package. When the semiconductor integrated circuit is sorted, packaged, carried, or operated, the chip is electrified positively or negatively due to contact with the exterior objects. Thereafter, when the pin contacts with an electric conductor, static electricity is discharged through a route from the chip to the pin and then the electric conductor. In this case, for example, a gate oxide film of an nMOS transistor of a first-stage input circuit may be broken down in the chip. This phenomenon is referred to as "breakdown due to CDM (Charge Device Model)."

To prevent the breakdown due to CDM, it is necessary to prevent a potential difference from occurring between an input wiring and the ground wiring of the first-stage input circuit. Therefore, it is necessary to set an overvoltage protection circuit for absorbing the potential difference between the input wiring and the ground wiring of the first-stage input circuit.

Figure 5:
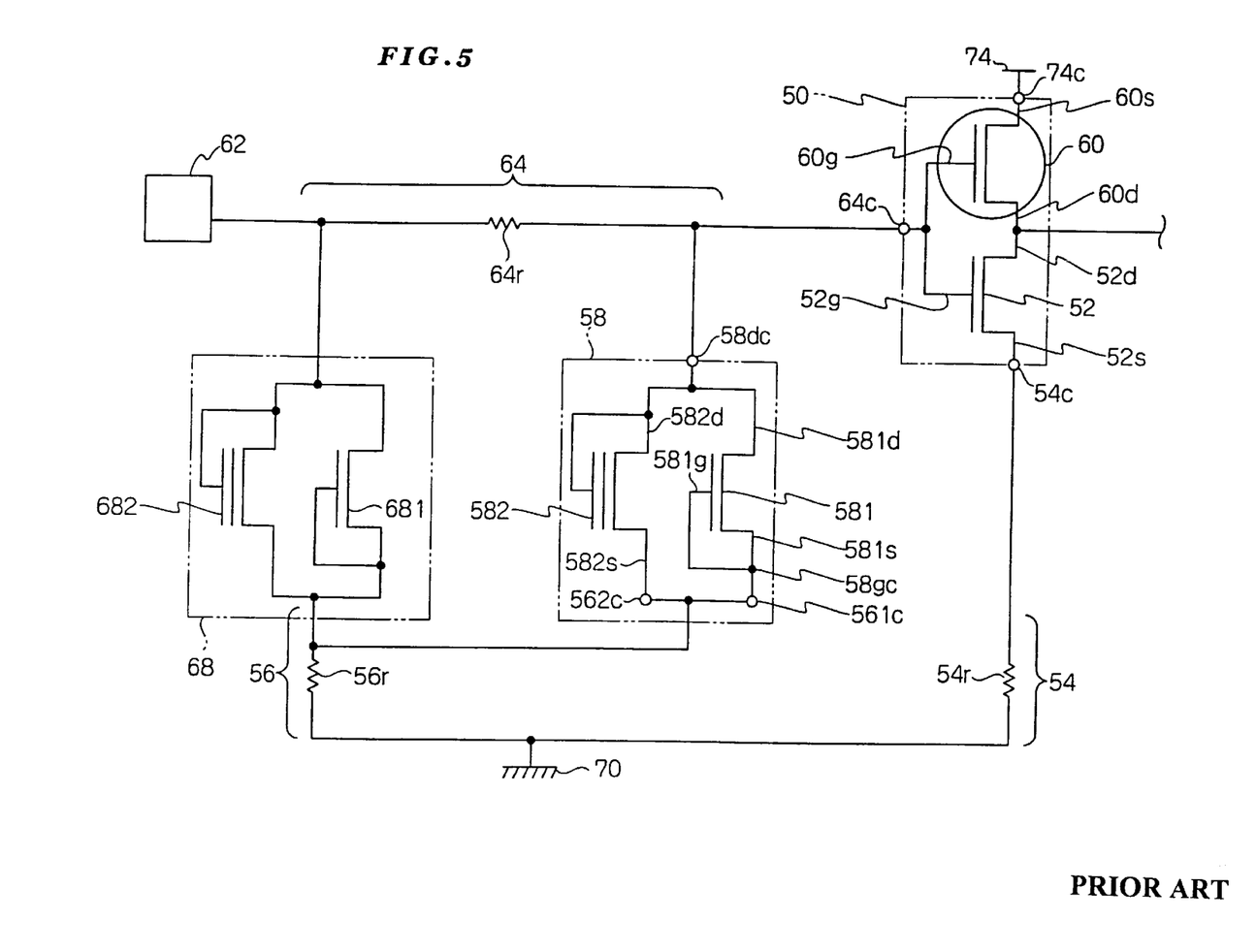
FIG. 5 is an equivalent circuit diagram showing a conventional semiconductor integrated circuit.

FIG. 5 is an equivalent-circuit diagram showing the above conventional semiconductor integrated circuit. The semiconductor integrated circuit will be hereafter described by referring to FIG. 5.

In case of a conventional semiconductor integrated circuit, a source electrode 52s of an nMOS transistor 52 constituting an first-stage input circuit 50 is connected to a ground wiring 54 and an overvoltage protection circuit 58 is connected between a ground wiring 56 and a gate electrode 52g of the nMOS transistor 52. The overvoltage protection circuit 58 is comprised of a discharge device 581 having an nMOS transistor structure with which a gate electrode 581g and a source electrode 581s are connected and a discharge device 582 having an nMOS transistor structure with no gate electrode. In case of discharge devices 581 and 582, their respective drain electrodes 581d and 582d are connected to the gate electrode 52g of the nMOS transistor 52 and their respective source electrodes 581s and 582s are connected to the source electrode 52s of the nMOS transistor 52.

A pMOS transistor 60 is provided at the first-stage input circuit 50. The gate electrodes 52g and 60g of the nMOS transistor 52 and the pMOS transistor 60 are connected with an input pad 62 by an input wiring 64. Another overvoltage protection circuit 68 is connected between the ground wiring 56 and an input pad 62. The overvoltage protection circuit 68 has a configuration almost same as that of the overvoltage protection circuit 58 but has a size different from that of the overvoltage protection circuit 58 and is comprised of discharge devices 681 and 682. Parasitic resistances 54r and 56r denote resistance values of ground wirings 54 and 56. A parasitic resistance 64r denotes a resistance value of the input wiring 64. Moreover, the overvoltage protection circuit 68 protects the nMOS transistor 52 from an overvoltage (ESD) mainly applied to the input pad 62. Contact holes 74c, 64c, 54c, 58dc, 58gc, 561c, and 562c, a power-supply wiring 74, and a ground pad 70 will be described later.

Figure 6:
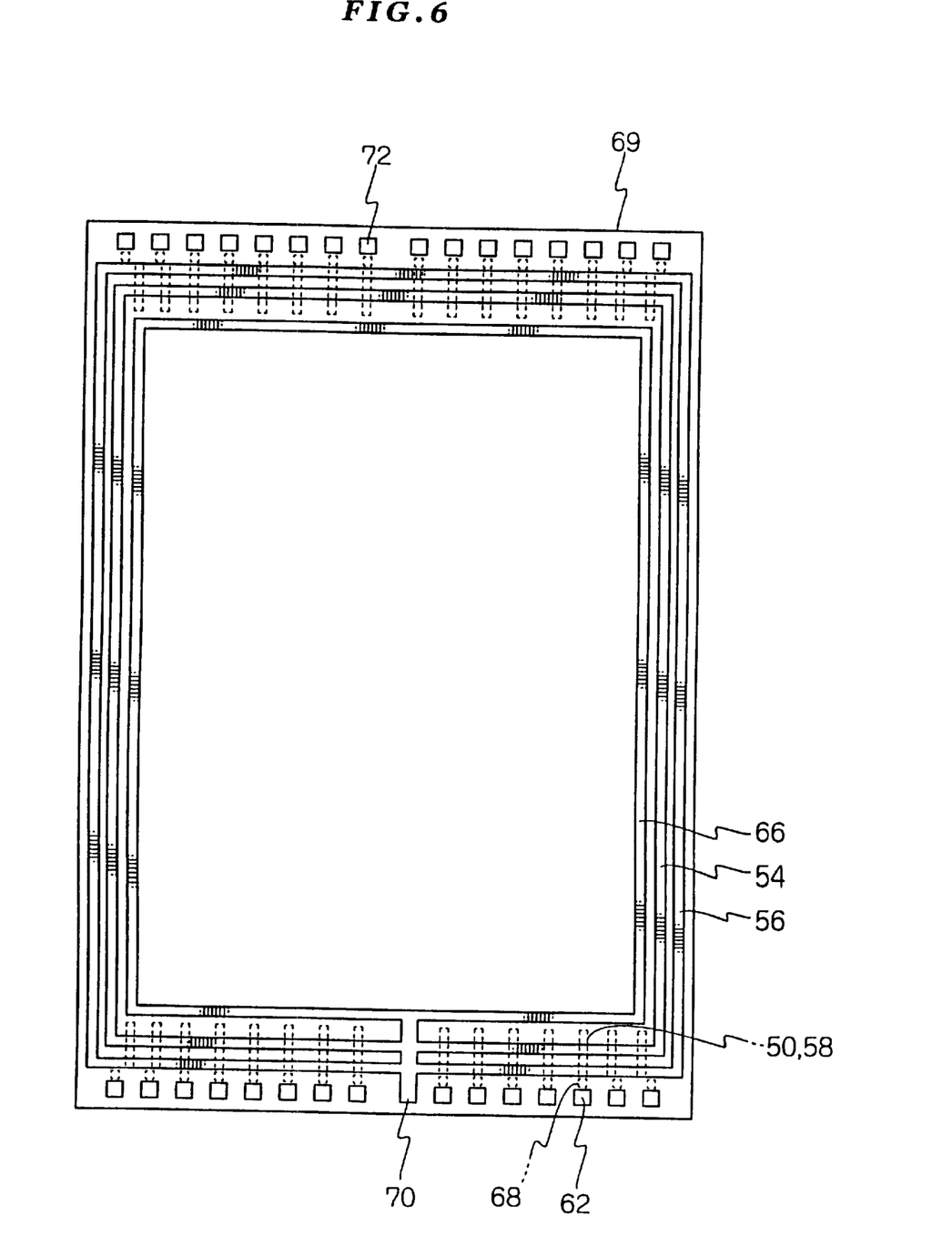
FIG. 6 is a top view showing the entire chip of the semiconductor integrated circuit of FIG. 5.

FIG. 6 is a top view showing the entire chip of the semiconductor integrated circuit of FIG. 5. Hereafter, description is made by referring to FIGS. 5 and 6. In FIG. 6, a portion same as that of FIG. 5 is provided with the same symbol and their duplicate description is omitted.

In the case of chip 69, ground wirings 54, 56, and 66 are connected to each other nearby the ground pad 70. Therefore, the parasitic resistance 54r denotes the resistance value of the ground wiring 54 from the first-stage input circuit 50 up to the ground pad 70. The parasitic resistance 56r denotes the resistance value of the ground wiring 56 from the overvoltage protection circuit 58 up to the ground pad 70. The ground wiring 54 is used for an first-stage input circuit, the ground wiring 56 is used for a protection circuit, and the ground wiring 66 is used for an internal cell. Moreover, a not-illustrated power-supply wiring is connected to a power-supply pad 72.

Figure 7:
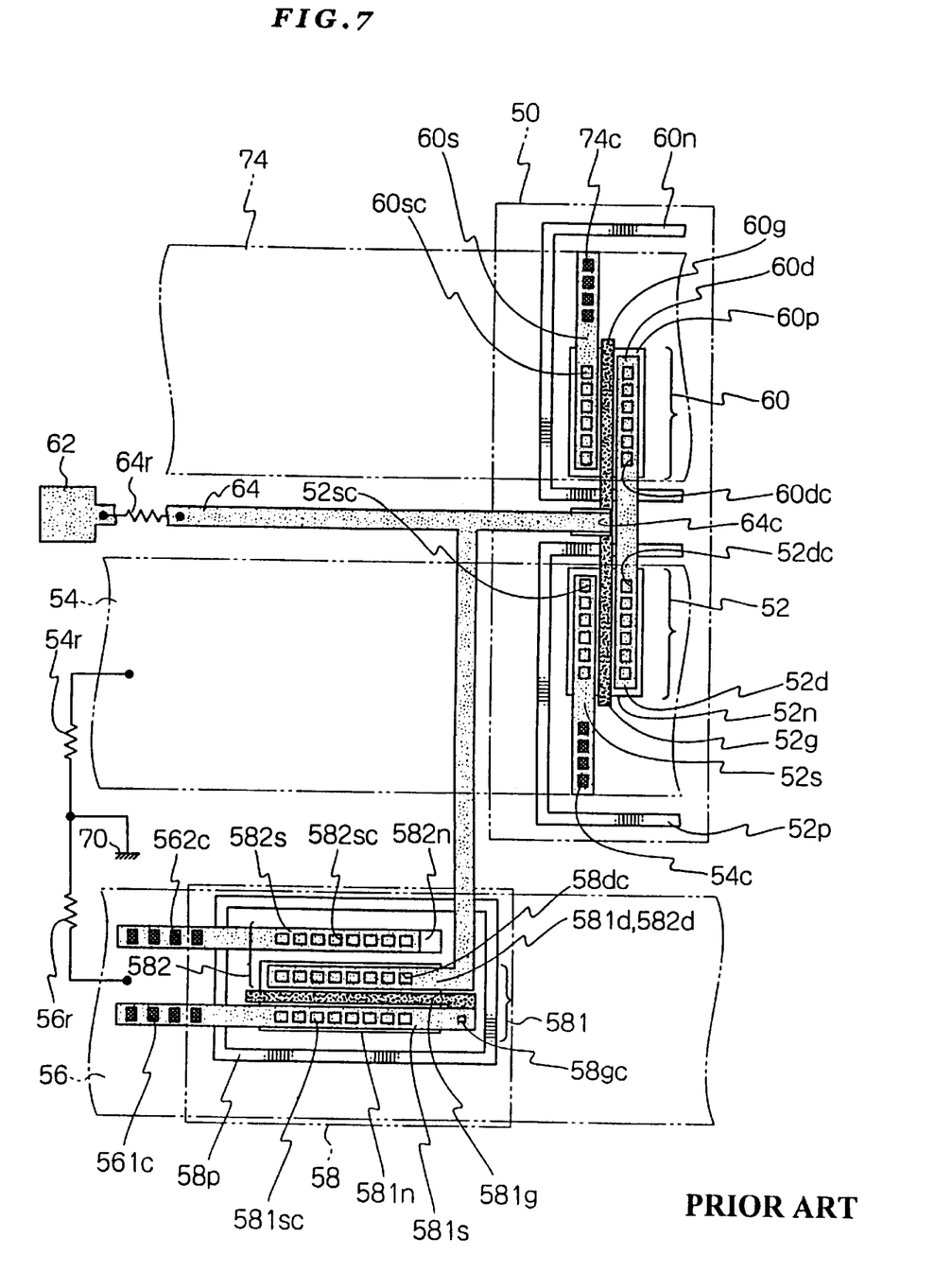
FIG. 7 is a top view showing a part of the wirings and diffusion layers in the semiconductor integrated circuit of FIG. 5.

FIG. 7 is a top view showing some of the wirings and diffusion layers of the semiconductor integrated circuit of FIG. 5. Hereafter, description will be made by referring to FIGS. 5 to 7. In FIG. 7, however, a portion which is the same as those of FIGS. 5 and 6 is provided with the same symbols and their duplicate description is omitted.

A $p^+$ layer 60p serving as a source region and a drain region is formed on a source electrode 60s and drain electrode 60d of the pMOS transistor 60. An $n^+$ layer 60n serving as a guard ring is formed around the pMOS transistor 60. An $n^+$ layer 52n serving as a source region and a drain region is formed on a source electrode 52s and a drain electrode 52d of the nMOS transistor 52. A $p^+$ layer 52p serving as a guard ring is formed around the nMOS transistor 52. $n^+$ layers 581n and 582n serving as a source region and a drain region are formed on the source electrodes 581s, 582s and the drain electrodes 581d and 582d of the discharge devices 581 and 582. A $p^+$ layer 58P serving as a guard ring is formed around the discharge devices 581 and 582.

The power-supply wiring 74 and the source electrode 60s are connected to each other by the contact hole 74c. The drain electrodes 60d and 52d are connected to each other. The ground wiring 54 and the source electrode 52s are connected each other by the contact hole 54c. The input wiring 64 and the gate electrodes 52g and 60g are connected each other by the contact hole 64c. The input wiring 64 and the drain electrodes 581d and 582d, etc. are connected each other. The ground wiring 56 and the source electrodes 581s and 582s are connected each other by the contact holes 561c and 562c. The source electrodes 581s and 581g are connected each other by the contact hole 58gc. Contact holes 60sc, 60dc, 52sc, 52dc, 581sc, 582sc, and 58dc are used to connect each electrode with each semiconductor layer. The input wiring 64, source electrodes 60s, 52s, 581s, and 582s and drain electrodes 60d, 52d, 581d, and 582d, etc. are formed by patterning the same electrode layer. The ground wirings 54 and 56 and the power-supply wiring 74, etc. are formed by patterning the same wiring layer. The wiring layer is superimposed on the electrode layer through a not-illustrated insulating film. The contact holes 74c, 54c, 561c, and 562c are formed on the insulating film.

Then, operations of the overvoltage protection circuit 58 will be described below by referring to FIGS. 5 to 7.

It is assumed that a chip 69 is positively electrified due to static electricity and under this state, a pin (not illustrated) connected to the input pad 62 contacts an electric conductor. Then, the discharge devices 581 and 582 are turned on and static electricity is discharged through a route formed from the ground wirings 54 and 56 to the overvoltage protection circuit 58 and input pad 62. In this case, an overvoltage is generated between the source electrode 52s and the gate electrode 52g of the nMOS transistor 52. To protect the nMOS transistor 52 from the overvoltage, the overvoltage protection circuit 58 operates. That is, the discharge devices 581 and 582 are turned on to absorb the overvoltage between the source electrode 52s and the gate electrode 52g. Thus, the gate-electrode oxide film of the nMOS transistor 52 is prevented from being broken down due to CDM.

Moreover, another conventional example will be shown below. That is, Japanese Patent Application Laid-Open No. 9-139468 discloses a semiconductor device making it possible to adjacently arrange a protecting device and an device to be protected without lowering an electrostatic-breakdown withstand voltage and reduce a dead space in the semiconductor device.

Furthermore, the official gazette of Japanese Patent Application Laid-Open No. 4-30570 discloses a semiconductor device making it possible to securely protect internal circuits from electrostatic noises.

BRIEF SUMMARY OF THE INVENTION

Object of the Invention

In FIG. 5, two overvoltage protection circuits 58 and 68 are provided. In this case, the overvoltage protection circuit 68 operates mainly when static electricity or the like is applied to the input pad 62 and the overvoltage protection circuit 58 operates when a chip is electrified. That is, the overvoltage protection circuit 68 is used for preventing an ESD (electrostatic discharge damage) and the overvoltage protection circuit 58 is used for preventing the above-described CDM. Therefore, as shown in FIG. 6, the overvoltage protection circuit 68 is set nearby the input pad 62 and the overvoltage protection circuit 58 is set nearby the first-stage input circuit 50 (refer to FIG. 7). Therefore, the parasitic resistance 54r of the ground wiring 54 and the parasitic resistance 56r of the ground wiring 56 are positioned between the contact hole 54c serving as the ground connection end of the first-stage input circuit 50 and the contact holes 561c and 562c serving as ground connection ends of the overvoltage protection circuit 58. Thus, the ground potential of the first-stage input circuit 50 is different from that of the overvoltage protection circuit 58. Thereby, voltages of the parasitic resistances 54r and 56r drop when static electricity is discharged and therefore, the overvoltage protection circuit 58 is not always operated by the voltage between the source electrode 52s and the gate electrode 52g. Therefore, the overvoltage protection circuit 58 may not properly operate.

Thus, it is an object of the present invention to provide a semiconductor integrated circuit having a reliability improved by properly operating an overvoltage protection circuit.

SUMMARY OF THE INVENTION

In a semiconductor integrated circuit of the present invention a transistor connected to an input wiring is connected to any one of ground wirings and an overvoltage protection circuit is connected between the ground wiring with which the transistor is connected and the input wiring. The transistor uses a field-effect transistor, bipolar transistor, or static-induction transistor, etc. The field-effect transistor uses an nMOS transistor or pMOS transistor, etc.

When a pin connected to an input pad contacts with an electric conductor while a chip is electrified due to static electricity, the static electricity is discharged from the ground wiring in the chip toward the input pad. In this case, an overvoltage is generated between electrodes of a transistor in the first-stage input circuit connected to the input pad. To absorb the overvoltage, an overvoltage protection circuit is operated.

An overvoltage protection circuit of the prior art is connected between a ground wiring different from a ground wiring to which a transistor is connected and an input wiring. Therefore, a parasitic resistance having the resistance value of each ground wiring is connected between the transistor and the overvoltage protection circuit. Therefore, the overvoltage protection circuit is not always operated by the inter-electrode voltage of the transistor.

On the other hand, an overvoltage protection circuit of the present invention is connected between a ground wiring to which a transistor is connected and an input wiring. Therefore, the resistance value between the transistor and the overvoltage protection circuit is greatly decreased. Accordingly, the overvoltage protection circuit is operated by the inter-electrode voltage of the transistor.

In other words, a semiconductor integrated circuit of the present invention comprises a first ground wiring for a protection circuit and a second ground wiring for a first-stage input circuit extended in parallel, and the source electrode of a field-effect transistor constituting the first-stage input circuit and connected to the second ground wiring, and an overvoltage protection circuit having a two-terminal-device structure for absorbing an overvoltage generated between the gate electrode and the source electrode of the field-effect transistor and provided nearby the field-effect transistor; wherein one terminal of the overvoltage protection circuit is connected to the second ground wiring at the minimum distance.

BRIEF DESCRIPTION OF THE DRAWINGS

FIGS. 4A and 4B are graphs showing voltage-current characteristics of discharge devices in the semiconductor integrated circuit of FIG. 1, in which FIG. 4A shows the voltage-current characteristic of a first discharge device and FIG. 4B shows the voltage-current characteristic of a second discharge device;

DETAILED DESCRIPTION OF THE PREFERRED EMBODIMENTS

Figure 1:
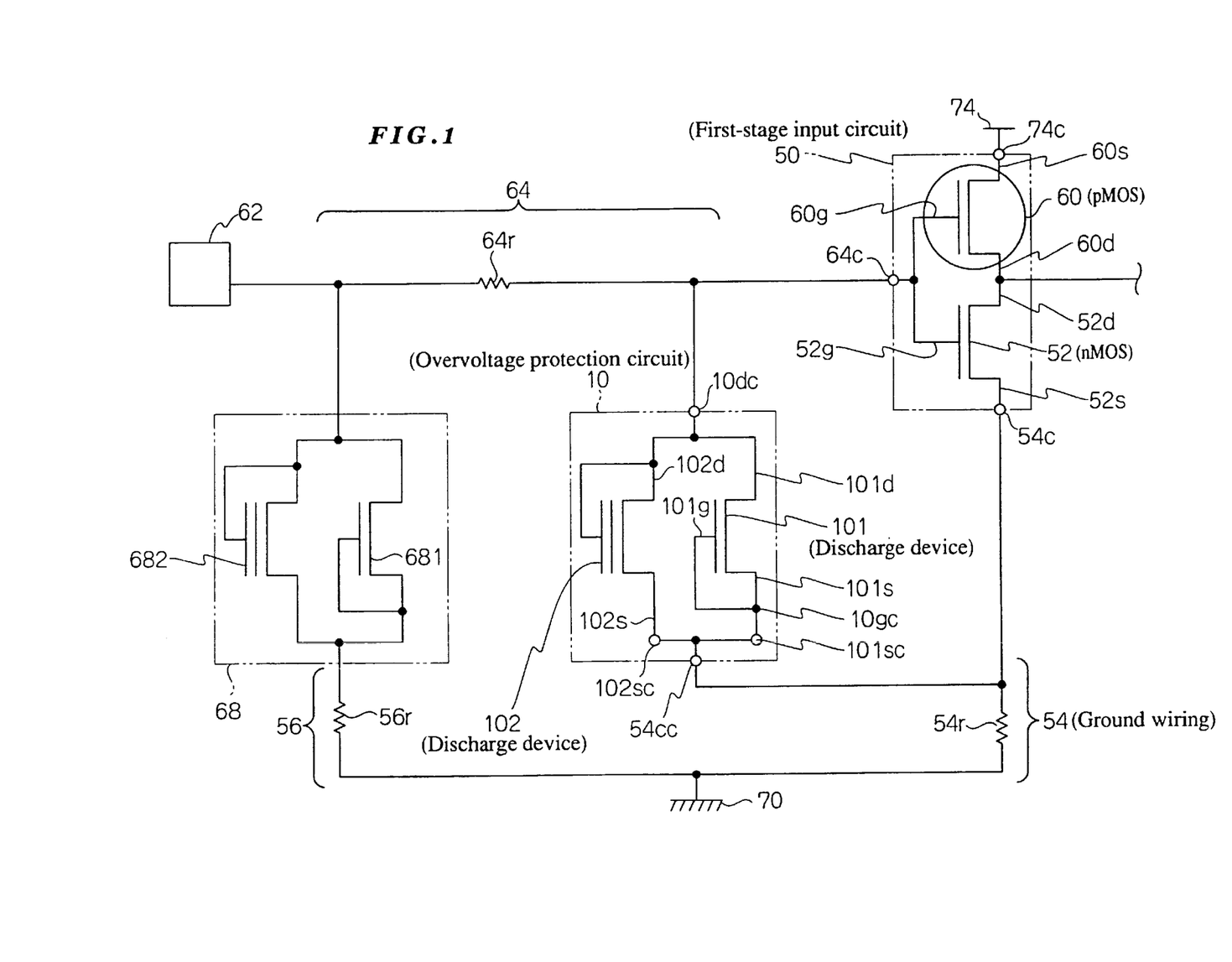
FIG. 1 is an equivalent circuit diagram showing an embodiment of a semiconductor integrated circuit of the present invention.

FIG. 1 is an equivalent circuit diagram showing an embodiment of a semiconductor integrated circuit of the present invention. Hereafter, description will be made by referring to FIG. 1.

In the case of a semiconductor integrated circuit of the present, the source electrode 52s of an nMOS transistor 52 comprising a first-stage input circuit 50 is connected with a ground wiring 54, and an overvoltage protection circuit 10 is comprised between the ground wiring 54 and the gate electrode 52g of the nMOS transistor 52. The overvoltage protection circuit 10 is comprised of a discharge device 101 having an nMOS transistor structure with which a gate electrode 101g and a source electrode 101s are connected and a discharge device 102 having an nMOS transistor structure with no gate electrode. In case of the discharge devices 101 and 102, their respective drain electrodes 101d and 102d are connected to the gate electrode 52g of the nMOS transistor 52 and their respective source electrodes 101s and 102s are connected to the source electrode 52s of the nMOS transistor 52.

The first-stage input circuit 50 is an inverter circuit provided with a pMOS transistor 60. The gate electrodes 52g and 60g of the nMOS transistor 52 and the pMOS transistor 60 and an input pad 62 are connected each to other by an input wiring 64. Another overvoltage protection circuit 68 is comprised between a ground wiring 56 and the input pad 62. The overvoltage protection circuit 68 is comprised of discharge devices 681 and 682. The overvoltage protection circuit 68 has a channel width of approx. 400 "m and the overvoltage protection circuit 10 has a channel width of approx. 100 "m. Parasitic resistances 54r and 56r denote resistance values of the ground wirings 54 and 56. The parasitic resistance 64r denotes the resistance value of the input wiring 64. Contact holes 74c, 64c, 54c, 10dc, 10gc, 101sc, 102sc, and 54cc, a power-supply wiring 74, and a ground pad 70, etc. will be described later.

Figure 2:
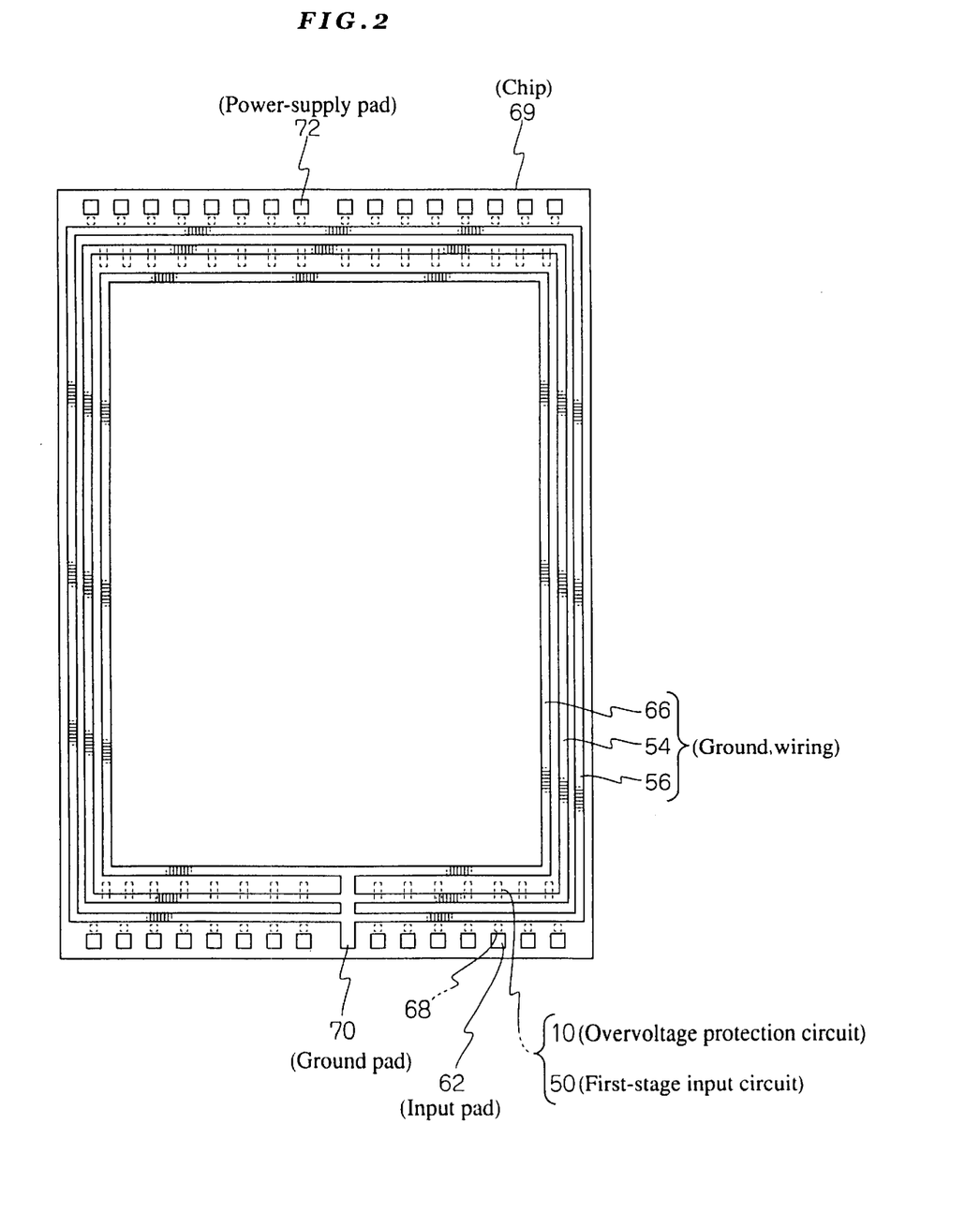
FIG. 2 is a top view showing the entire chip of the semiconductor integrated circuit of FIG. 1.

FIG. 2 is a top view showing the entire chip of the semiconductor integrated circuit of FIG. 1. Hereafter, description will be made by referring to FIGS. 1 and 2. In FIG. 2, however, a portion same as that of FIG. 1 is provided with the same symbol and their duplicate description is omitted.

A chip 69 is a middle-speed SRAM (static random access memory). In case of the chip 69, ground wirings 54, 56, and 66 are connected each other near the ground pad 70. Accordingly, the parasitic resistance 54r denotes the resistance value of the ground wiring 54 from the first-stage input circuit 50 up to the ground pad 70. The ground wiring 54 is used for a first-stage input circuit, the ground wiring 56 is used for a protection circuit, and the ground wiring 66 is used for an internal cell. Moreover, a not-illustrated power-supply wiring is connected to a power-supply pad 72.

Figure 3:
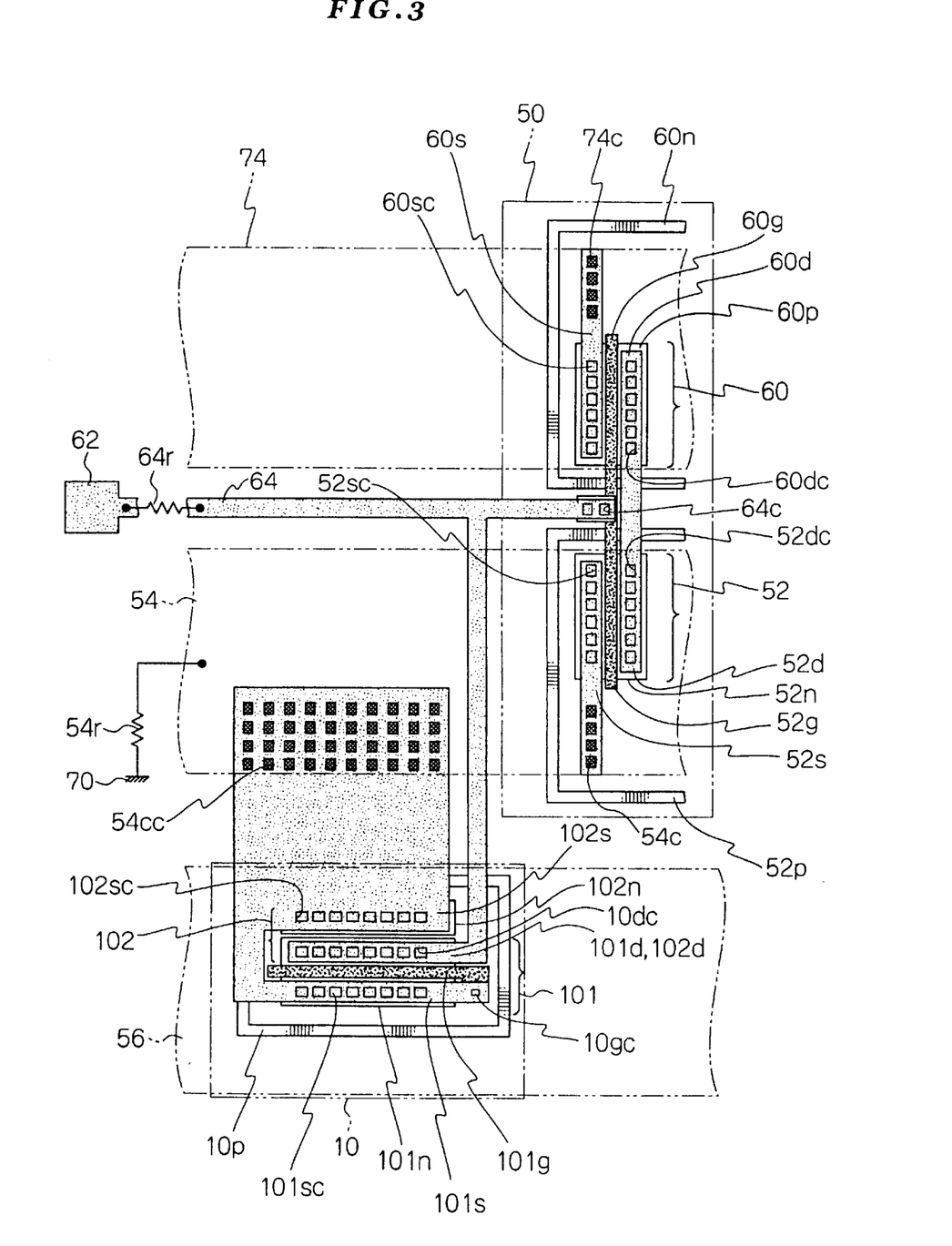
FIG. 3 is a top view showing a part of the wirings and diffusion layers in the semiconductor integrated circuit of FIG. 1.

FIG. 3 is a top view showing some of wirings and diffusion layers of the semiconductor integrated circuit of FIG. 1. Hereafter, description will be made by referring to FIGS. 1 to 3. However, in FIG. 3, a portion same as that of FIGS. 1 and 2 is provided with the same symbol and their duplicate description is omitted.

A p$^+$ layer 60p serving as a source region and a drain region is formed on the source electrode 60s and drain electrode 60d of the pMOS transistor 60. An n$^+$ layer 60n serving as a guard ring is formed around the pMOS transistor 60. An n$^+$ layer 52n serving as a source region and a drain region is formed on the source electrode 52s and drain electrode 52d of the nMOS transistor 52. A p$^+$ layer 52p serving as a guard ring is formed around the nMOS transistor 52. Two n$^+$ layers 101n and 102n serving as a source region and a drain region are formed on the source electrodes 101s and 102s and the drain electrodes 101d and 102d of the discharge devices 101 and 102. A p$^+$ layer 10p serving as a guard ring is formed around the discharge devices 101 and 102.

The power-supply wiring 74 and the source electrode 60s are connected to each other by the contact hole 74c. The drain electrodes 60d and 52d are connected to each other. The ground wiring 54 and the source electrode 52s are connected to each other by the contact hole 54c. The input wiring 64 and the gate electrodes 52g and 60g are connected to each other by the contact hole 64c. The input wiring 64 and the drain electrodes 101d and 102d are connected to each other. The ground wiring 54 and the source electrodes 101s and 102s are connected to each other by the contact hole 54cc. The source electrode 101s and the gate electrode 101g are connected to each other by the contact hole 10gc. Contact holes 60sc, 60dc, 52sc, 52dc, 101sc, 102sc, and 10dc are used to connect each electrode with each semiconductor layer. The input wiring 64, source electrodes 60s, 52s, 101s, and 102s, and drain electrodes 60d, 52d, 101d, and 102d, etc. are formed by patterning the same electrode layer made of aluminum. The ground wirings 54 and 56 and the power-supply wiring 74 are formed by patterning the same wiring layer made of aluminum. A wiring layer is superimposed on the electrode layer through a not-illustrated insulating film. The contact holes 74c, 54c, and 54cc are formed on the insulating film.

Figure 4A:
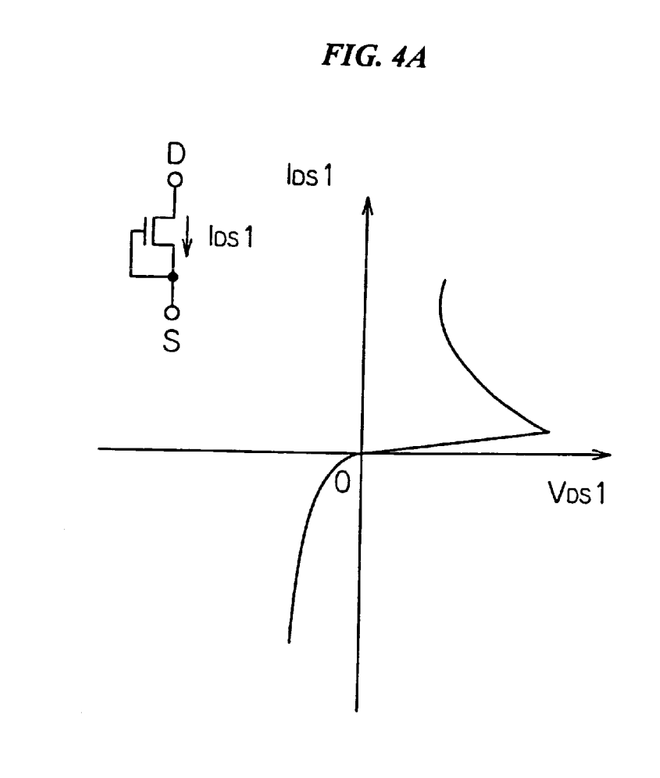
Figure 4B:
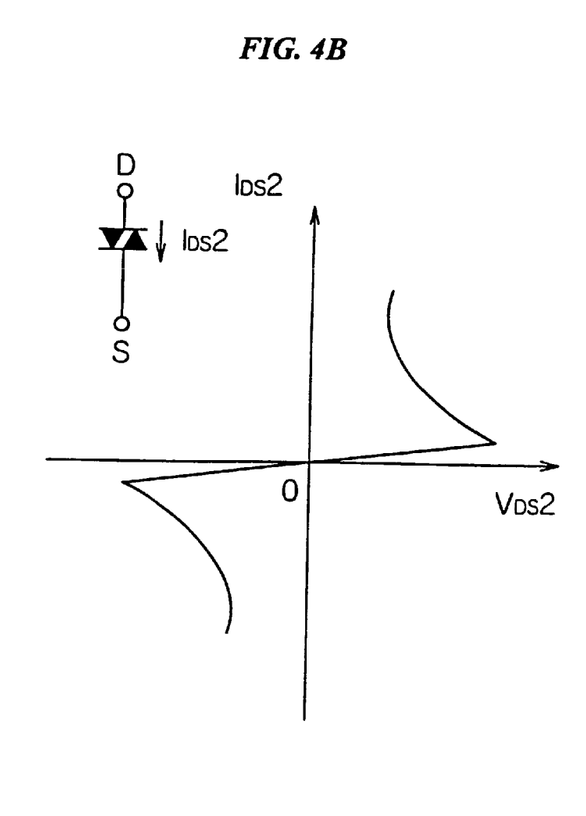

FIGS. 4A and 4B are graphs showing the voltage current characteristics of the discharge devices 101 and 102, in which FIG. 4A shows the characteristic of the discharge device 101 and FIG. 4B shows the characteristics of the discharge device 102. The operations of the overvoltage protection circuit 10 will be described below by referring to FIGS. 1 to 4B.

The overvoltage protection circuit 10 has a two-terminal-device structure having a first electrode comprised of the drain electrodes 101d and 102d and a second electrode comprised of the source electrodes 101s and 102s. The discharge device 101 has an nMOS transistor structure with which the gate electrode 101g and the source electrode 101s are connected and in which an npn semiconductor layer is formed between the source electrode 101s and the drain electrode 101d. The discharge device 102 has an nMOS transistor structure having no gate electrode, in which an npn semiconductor layer is formed between the source electrode 102s and the drain electrode 102d. In FIGS. 4A and 4B when assuming a case in which the voltage of the drain electrode is higher than that of the source electrode as the forward direction, the discharge device 101 operates as a DIAC (diode AC switch) for a forward-directional voltage but operates as a load transistor for a backward-directional voltage. The discharge device 101 operates as a DIAC for a forward- and backward-directional voltages.

In this case, it is assumed that a pin (not illustrated) connected to the input pad 62 contacts with an electric conductor while the chip 69 is electrified due to static electricity. Then, the discharge devices 101 and 102 are turned on and thereby, the static electricity is discharged through a route from the ground wiring 54 to the overvoltage protection circuit 10 and input pad 62. In this case, an overvoltage is generated between the source electrode 52s and the gate electrode 52g of the nMOS transistor 52. To protect the nMOS transistor 52 from the overvoltage, the overvoltage protection circuit 10 operates. That is, the discharge devices 101 and 102 are instantaneously turned on to absorb the overvoltage generated between the source electrode 52s and the gate electrode 52g. More accurately, because characteristics in the third quadrants of FIGS. 4A and 4B are obtained, the discharge device 101 is first turned on and then the discharge device 102 is turned on. Thus, the gate oxide film of the nMOS transistor 52 is prevented from being broken down due to CDM.

The overvoltage protection circuit 10 is connected between the ground wiring 54 to which the source electrode 52s is connected and the gate electrode 52g. Therefore, the source electrode 52s and the overvoltage protection circuit 10 are almost short-circuited. Accordingly, the overvoltage protection circuit 10 is operated by the voltage between the source electrode 52s and the gate electrode 52g of the nMOS transistor 52.

According to the semiconductor integrated circuit of the present invention, it is possible to greatly reduce the wiring resistance between a transistor and an overvoltage protection circuit because of connecting the overvoltage protection circuit between the input and ground wirings to which the transistor is connected. Accordingly, because applied voltage values of the transistor and the overvoltage protection circuit are equalized each other when an overvoltage is generated, the overvoltage protection circuit properly operates and thereby, the transistor can be protected. Thus, it is possible to improve the reliability. For example, though a withstand voltage is 400 V in the case of the prior art, it is possible to improve the withstand voltage up to approx. 2,000 V in case of the present invention. Moreover, the overvoltage protection circuit can be formed below a power-supply wiring, ground wiring, or signal wiring and therefore there is not influenced of the semiconductor integrated circuit on a chip size.

According to one aspect of the invention, it is possible to greatly reduce the wiring resistance between the source electrode of the field-effect transistor of a first-stage input circuit and overvoltage protection circuit because of connecting the overvoltage protection circuit between an input wiring to which the gate electrode of the field-effect transistor is connected and a ground wiring to which the source electrode of the is transistor connected.

According to another aspect of the invention in which an overvoltage protection circuit has a first electrode and a second electrode, and the first electrode is connected to an input wiring, and the second electrode is formed by patterning an electrode layer, first and second ground wirings are formed by patterning the same wiring layer, and the wiring layer is superimposed on the electrode layer through an insulating layer. With such a structure, it is possible to connect a ground wiring to which the source electrode of a field-effect transistor is connected with the overvoltage protection circuit by connecting the second electrode with the second ground wiring. Therefore, it is possible to fabricate a semiconductor integrated circuit of the present invention by providing the simple process change of only changing a mask for forming a contact hole on the insulating layer and mask for patterning the electrode layer for the prior art.

According to the semiconductor integrated circuit of claim 6, it is possible to fabricate an overvoltage protection circuit in the same step as that of the field-effect transistor of a first-stage input circuit because the overvoltage protection circuit is comprised of a discharge device having a field-effect-transistor structure.

Additionally, in a further aspect of the invention, it is possible to fabricate an overvoltage protection circuit in the same step as that of the field-effect transistor of a first-stage input circuit because the overvoltage protection circuit is comprised of a discharge device having a field-effect-transistor structure.

The entire disclosure of Japanese Patent Application No. 10-094673 (Filed on Apr. 7$^{th,}$ 1998) including specification, claims, drawings and summary are incorporated herein by reference in its entirety.

What is claimed is:

1. A semiconductor integrated circuit comprising:
 means for providing a first-stage input, said first-stage input means comprising an input pad, an input wiring, and an input circuit including a first transistor connected to said input wiring;
 means for providing overvoltage protection connected to said input wiring, said overvoltage protection means including a first protection means with a second transistor and a second protection means with a third transistor; and
 a plurality of ground wirings for said first-stage input means and said overvoltage protection means,
 wherein said plurality of ground wirings comprise a first ground wiring for a protection circuit and a second ground wiring for a first-stage input circuit, and
 wherein the first transistor is connected to the second ground wiring and the second protection means is connected between the second ground wiring and the input wiring.

2. A semiconductor integrated circuit comprising:
 means for providing a first-stage input, said first-stage input means comprising an input pad, an input wiring, and an input circuit including a first transistor connected to said input wiring;
 means for providing overvoltage protection connected to said input wiring, said overvoltage protection means including a first protection means with a second transistor and a second protection means with a third transistor; and
 a plurality of ground wirings for said first-stage input means and said overvoltage protection means,
 wherein said third transistor has a narrower channel width than that of said second transistor,
 wherein said plurality of ground wirings comprise a first ground wiring for a protection circuit and a second ground wiring for a first-stage input circuit, and
 wherein the first transistor is connected to the second ground wiring and the second protection means is connected between the second ground wiring and the input wiring.

3. The semiconductor integrated circuit according to claim 2, wherein the transistor comprises a field-effect transistor.

4. The semiconductor integrated circuit according to claim 3, wherein the gate electrode of the field-effect transistor is connected to the input wiring, and
 the source electrode of the field-effect transistor is connected to the second ground wiring, and the overvoltage protection means is connected between the second ground wiring and the input wiring.

5. The semiconductor integrated circuit according to claim 4, wherein the overvoltage protection means has a two-terminal-device structure having a first electrode and a second electrode, and
 the first electrode is connected to the input wiring, and the second electrode is connected to the second ground wiring and formed by patterning an electrode layer, and
 the first and second ground wirings are formed by patterning the same wiring layer, and the wiring layer is superimposed on the electrode layer through an insulating layer.

6. The semiconductor integrated circuit according to claim 3, wherein the overvoltage protection means comprises a discharge device having a field-effect transistor structure.

7. The circuit according to claim 4, wherein the overvoltage protection means comprises a discharge device having a field-effect-transistor structure.

8. A semiconductor integrated circuit comprising:
an input wiring connected with an input pad;
a first-stage input circuit including a first transistor connected with said input wiring;
a first protection circuit including a second transistor connected with said input wiring; and
a second protection circuit connected with said input wiring at a position closer to said first stage input circuit than said first protection circuit, and containing a third transistor; and
a first ground wiring connected with said first transistor, wherein said third transistor is connected with said first ground wiring.

9. A semiconductor integrated circuit comprising:
an input wiring connected with an input pad;
a first-stage input circuit including a first transistor connected with said input wiring;
a first protection circuit including a second transistor connected with said input wiring; and
a second protection circuit connected with said input wiring at a position closer to said first stage input circuit than said first protection circuit, and containing a third transistor having a narrower channel width than that of said second transistor;
a first ground wiring connected with said first transistor; and
a second ground wiring connected with said second transistor,
wherein said third transistor is connected with said first ground wiring.

10. The semiconductor integrated circuit according to claim 9, wherein said first transistor comprises a field-effect transistor.

11. The semiconductor integrated circuit according to claim 10, wherein a gate electrode of said field-effect transistor is connected to said input wiring, and a source electrode of said field-effect transistor is connected to said first ground wiring.

12. The semiconductor integrated circuit according to claim 11, wherein said second protection circuit has a two-terminal-device structure having a first electrode and a second electrode, and
wherein the first electrode is connected to said input wiring and the second electrode is connected to said first ground wiring and formed by patterning an electrode layer,
wherein the first and second ground wirings are formed by patterning the same wiring layer, and
wherein the wiring layer is superimposed on the electrode layer through an insulating layer.

13. The circuit as claimed in claim 1, wherein said third transistor has a narrower channel width than that of said second transistor.

14. The circuit as claimed in claim 1, wherein said first transistor comprises a field-effect transistor.

15. The semiconductor integrated circuit according to claim 14, wherein the gate electrode of the field-effect transistor is connected to the input wiring, and
the source electrode of the field-effect transistor is connected to the second ground wiring.

16. The semiconductor integrated circuit according to claim 1, wherein the overvoltage protection means includes a two-terminal-device structure having a first electrode and a second electrode, and
the first electrode is connected to the input wiring, and the second electrode is connected to the second ground wiring.

17. The semiconductor integrated circuit according to claim 8, wherein said third transistor has a narrower channel width than that of said second transistor.

18. The semiconductor integrated circuit according to claim 8, further comprising:
a second ground wiring connected with said second transistor.

19. The semiconductor integrated circuit according to claim 8, wherein said first transistor comprises a field-effect transistor.

20. The semiconductor integrated circuit according to claim 19, wherein a gate electrode of said field-effect transistor is connected to said input wiring, and a source electrode of said field-effect transistor is connected to said first ground wiring.

21. The semiconductor integrated circuit according to claim 8, wherein said second protection circuit includes a two-terminal-device structure having a first electrode and a second electrode, and
wherein the first electrode is connected to said input wiring and the second electrode is connected to said first ground wiring.

* * * * *